United States Patent [19]

Seal

[11] 3,721,289

[45] March 20, 1973

[54] METHOD AND MEANS OF MAKING DIAMOND HEAT SINKS AND HEAT SINKS OBTAINED BY THIS METHOD

[75] Inventor: Michael Seal, Amsterdam, Netherlands

[73] Assignee: D. Drukker & ZN.N.V., Amsterdam, Netherlands

[22] Filed: March 11, 1970

[21] Appl. No.: 18,620

[30] Foreign Application Priority Data

March 13, 1969 Netherlands ........................6903862

[52] U.S. Cl. ....................165/80, 165/185, 317/234, 174/15, 331/94.5

[51] Int. Cl. ............................................H01l 1/12

[58] Field of Search ...317/234; 174/15; 165/80, 185; 331/94.5

[56] References Cited

UNITED STATES PATENTS 3,393,088 7/1968 Manasevit et al............317/234 A X

OTHER PUBLICATIONS

Swan, CB Improved Performance...Diamond Heat Sinks, Proceedings of IEEE, 9/1967, pgs. 1617–1618.
Swan, CB Importance of Providing a Good Heat Sink, Procs. of IEEE, 3/1967, pgs. 451–452.
Josenhans, JG Diamond as an Insulating Heat Sink, Procs. of IEEE, 4/1968, pgs. 762–763.

*Primary Examiner*—Albert W. Davis, Jr.
*Attorney*—Waters, Roditi, Schwartz & Nissen

[57] ABSTRACT

A method of making diamond heat sinks for mounting small power-dissipating devices, such as semi-conductor devices and solid-state lasers, in which diamonds of the type II A are selected having a level or rising light transmission curve for infrared rays in the wave length range of 7 to 8 micrometer wave length. The selected diamonds are sawn into slices which are polished on both their sawn parallel faces and which are then cut in two directions normal to each other to obtain block-shaped diamond heat sink bodies of a weight in the range of 0.0005 to 0.02 carat. In sawing the diamond slices a saw guide comb is used for guiding the saw blade along straight paths.

2 Claims, 4 Drawing Figures

METHOD AND MEANS OF MAKING DIAMOND HEAT SINKS AND HEAT SINKS OBTAINED BY THIS METHOD

BACKGROUND OF THE INVENTION

The invention relates to a method of making diamond heat sinks, in particular for use in power-dissipating solid-state devices, such as semi-conductor devices and solid-state lasers.

Heat generation is a problem in many kinds of solid-state electronic devices such as transistors, Gunn diodes, avalanche diodes and the like. Each of these comprises a small piece or chip or layer of a material with special electronic or semi-conducting properties through which electric current passes during the operation of the device. As a consequence electrical power is dissipated and heat generated which should be removed. In such devices as solid-state lasers likewise power is dissipated and heat generated during their operating mode. For design optimization and for electrical and other reasons such pieces or chips or other elements have generally very small dimensions, for instance in the order of a few tenths or hundredths of a millimeter across, whereby the specific power dissipation can become relatively high. It is therefore important that efficient heat sink means are provided to remove the heat from the small operating volume of the device concerned.

It has been normal practice to use a small block of metal, such as copper, as a heat sink and as a carrier for the small solid-state element. It has further been suggested to employ a heat sink consisting of a piece of diamond of the type II A (see for instance C.B Swan, Proceedings of the I.E.E.E., pages 451, 452 and pages 1,617, 1,618 (1967). J. G. Josenhans, Proceedings of the I.E.E.E., 56, pages 762, 763 (1968) and Bell Laboratories Record, 46, page 98 (1968)). It is well known that diamond has the highest thermal conductivity of all known materials at room temperature. Natural diamonds are generally classified in four types, type I A, type I B, type II A and type II B, respectively, depending on their impurity content. Of these four types, the type II A is the purest and has the highest thermal conductivity. The experiments described in the above-mentioned publications show that for instance a silicon diode mounted on a heat sink out from a diamond of the type II A has a much higher input power capability than when mounted on a heat sink of copper.

Diamond of the type II A covers as such still a range of different types of diamond material which differ in purity. Diamond is generally regarded as being of the type II A if it is substantially free of nitrogen impurity and not semi-conducting. To express this quantitatively one can say that diamonds containing more than about 0.05 percent of nitrogen would certainly be regarded as not of type II A, but there is no strict rule that purer diamonds are definitely of type II A. This depends also on the form in which the nitrogen impurity occurs in the crystal and some diamonds which were generally regarded as being of the type II A have been shown to contain traces of nitrogen. Phenomenologically, type I A and I B diamonds (called as a class together, type I) are found to have specific absorptions in the infrared spectrum which do not occur in type II A diamonds. Diamonds of the type I have a strong absorption system for infrared rays in the range between 7 and 8 micrometers, as can be measured, for example, with a Beckman "Microspec" infrared spectrophotometer. One obtains curves such as are shown in the diagrams of FIG. 1 of the annexed drawings which indicate for a number of diamonds of different type the light transmission characteristics in the above-mentioned range of the infrared spectrum. FIG. 1*a* shows the transmission curve for a strong type I diamond having a relatively high nitrogen content of for instance 0.2 percent. The curves of FIGS. 1*b* and 1*c* represent weaker type I diamonds having a lower nitrogen content of for instance 0.1 percent and 0.05 percent, respectively. Diamonds having a still lower nitrogen content in the order of 0.02 percent and having transmission curves for infrared rays as shown in FIGS. 1*d*–1*g* would generally be regarded as type II A diamonds, assuming that they are not semi-conductive which would make them of the type II B.

The experiments with diamonds of the type II A as a heat sink for semi-conductor devices, as described in the above-mentioned publications, were carried out with diamonds of relatively large size in the order of 0.05–0.2 carats. This means a very inefficient use of the expensive diamond material since it is only the small region of the diamond in close proximity to the semi-conductor device itself which is critical for the conduction of heat, and the device is usually less than 0.1 millimeter across. However, in the past one has not succeeded in manufacturing diamond pieces of the desired small dimensions in larger series and in an economic way, as would be a condition for the industrial use of such diamond pieces as heat sinks. Apart from this, it has appeared that the thermal conductivity of the type II A diamonds used so far, although as such relatively high, still varies considerably and that, therefore, the heat sinks made from these diamonds are not of uniform quality.

SUMMARY OF THE INVENTION

The invention has for its main object to provide a method of obtaining heat sinks of type II A diamonds having a very high and substantially uniform thermal conductivity.

Another important object of the invention is to provide a method for the industrial manufacture of such high quality diamond heat sinks of the desired small dimensions and configuration.

The invention is based on the discovery that in diamond of the type II A there appears to be a correlation between the absorption characteristics for light rays in the infrared spectrum and the thermal conductivity of the diamond.

Accordingly, the method of making diamond heat sinks according to the invention generally comprises determining the transmission characteristics for infrared rays in the range of 7 to 8 micrometers wave length of a group of diamonds, including diamonds of the type II A, selecting those diamonds having a substantially level or rising transmission curve in this wave length range, and preparing pieces from the diamonds so selected adapted for use as heat sinks.

In preparing heat sinks from the selected diamonds, the invention further contemplates sawing the selected diamonds by parallel cuts into a number of slices, polishing said slices on both the sawn parallel faces thereof until the measured thickness of the slices is reached, and cutting said slices in two directions substantially perpendicular to each other whereby to obtain substantially rectangular blocks of the desired dimensions.

The principles and the manner of application of the invention will become more clearly apparent during the course of the following detailed discussion with reference to preferred embodiments of the invention and to the annexed drawings.

BRIEF DESCRIPTION OF THE DRAWINGS

FIGS. 2, 3 and 4 show schematically an embodiment of a device for cutting a piece or slice of diamond into small blocks according to the invention, in which FIG. 2 is a front sectional view of the upper part of the device;

FIG. 3 is a side elevation of the device of FIG. 2; and

FIG. 4 shows a plan view, a front elevation and a side elevation, respectively, of the mounting plate for the diamond slice.

DETAILED DESCRIPTION OF THE INVENTION AND OF PREFERRED EMBODIMENTS THEREOF

In carrying out the method according to the invention, from a group of available diamonds first a rough preselection may be made as regards color, size, shape and quality. Diamonds of a light brown color are generally of type II A and are therefore chosen. However, other known and more accurate preselecting methods may be used although at this stage selection as to type is not critical. As regards size and shape, diamonds of a weight of 3 to 4 carats and of block-like configuration are preferred. Diamonds of bad quality are, of course, rejected.

The preselected diamonds are then examined as regards their transmission characteristics for infrared rays in the wave length range of 7 to 8 micrometers and their transmission curves in this wave length range are determined. This may be done by means well known in the art such as the Beckman "Microspec" infrared spectrophotometer above referred to.

Figure 1:
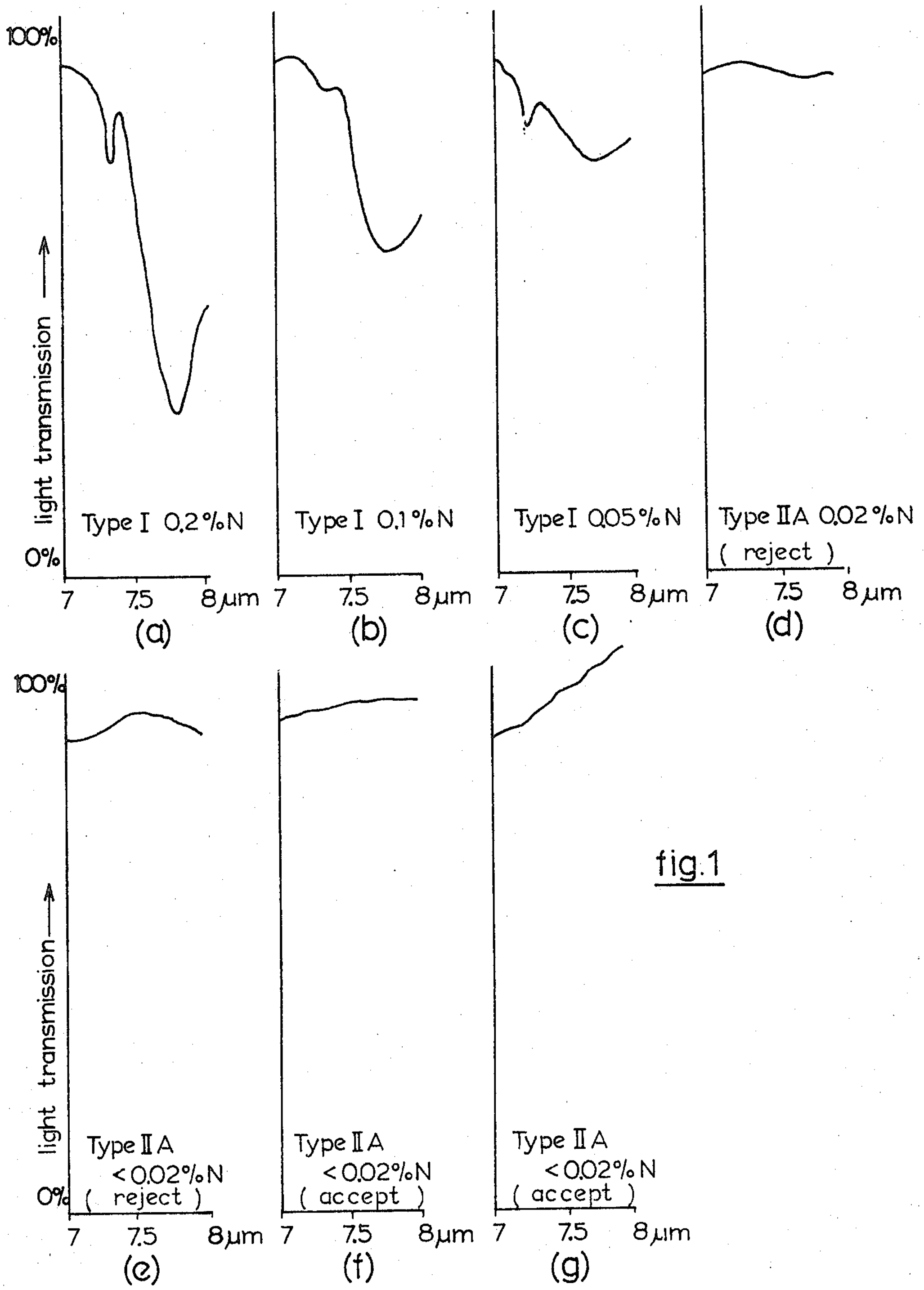
FIG. 1*a*–1*g* are diagrams showing for five different diamonds the light transmission (in per cent of total transmission) in the infrared spectrum between 0.7 and 0.8 micrometer wave length, FIG. 1*a*–1*c* relating to type I diamonds and FIG. 1*d*–1*g* relating to type II A diamonds, as above discussed.

With reference to the transmission characteristics of FIGS. 1*a*–1*g* of the drawing, in this selecting step of the invention the diamonds of the type II A having, at least partly, a falling transmission curve as shown in the FIGS. 1*d* and 1*e* are rejected, just as, of course, an occasional type I diamond (having a curve of the kind shown in FIGS. 1*a*–1*c*) which may be among the group of examined diamonds. On the other hand, diamonds having an approximately level or rising transmission curve as shown in the FIGS. 1*f* and 1*g* are selected for further preparation. Diamonds of this latter group having a level or rising transmission curve in the above-mentioned range of the infrared spectrum clearly show an even higher thermal conductivity than diamonds of the first group having transmission curves of the type as shown in the FIGS. 1*d* and 1*e*. Furthermore, this thermal conductivity of the group of diamonds so selected, i.e., having a flat or rising transmission curve in the 7–8 micrometers wave length range, varies relatively little. It is, therefore, possible to a manufacture from the diamonds so selected heat sinks of high and substantially uniform quality.

According to an important aspect of the invention, in making heat sinks of the desired shape and dimensions from the selected diamonds, these diamonds are first sawn by parallel cuts into a number of slices which slices are polished on both the sawn parallel faces thereof until the desired thickness of the slices is reached whereupon the slices are cut in two directions substantially perpendicular to each other so as to obtain substantially rectangular diamond blocks. These blocks preferably have a major dimension in the order of 0.3–1 millemeter or a weight range of approximately 0.0005–0.02 carat. The size of the diamond blocks depends of course on the size of the solid-state element to be mounted thereon but is chosen as small as efficient operation allows for optimum use of the expensive diamond material. However, with present technology it is not economic to make diamond pieces as small as 0.1 millimeter, nor is this desirable since some volume must be left to act as heat sink. The diamond blocks cut in the above-described manner have two parallel polished faces, one of which serves to mount the solid-state element and of which the other may serve as a parallel reference face by which to mount the diamond block in a holder. The other four side faces of the block can remain rough and need not be polished. The shape does not otherwise matter except that it is convenient to have a uniform rectangular or cubic shape for large scale production. However, this shape is not critical and it is possible to use blocks of different shapes.

The diamonds which has been selected in the above-described manner and as a whole meet the requirements as regards thermal conductivity, may each have parts of inferior quality. It is, therefore, generally necessary to perform a further selection on the slices or blocks cut from these diamonds to remove inferior pieces.

Diamonds of the type II A are generally birefringent to some extent, but their birefringence is of a different character to that shown by type I diamonds. Generally type II A diamonds show a pattern resembling a fine straw-mat, when viewed microscopically between crossed polarizers, whereas type I diamonds show a grosser structure of dark bands and clear areas and sometimes colored patches. The peculiar birefringence of type II A diamonds may be due to the presence of a high density of grown-in dislocations and forms a well known means of identifying this type of diamond.

According to the invention, this further selection may be performed by checking the purity of the diamond pieces by optically determining the state of strain of the crystal lattice of these pieces and by discarding those pieces showing internal strain variations across an area having in any one direction a dimension larger than 0.1 millimeter.

The above-mentioned optical test can be carried out as follows. The diamond slices or blocks which have been polished on both sides and are less than 1 millimeter thick are examined between crossed polarizers so as to check that they show the above-mentioned "straw-mat" pattern. Next, a "full wave plate" is added to the optical system between the crossed polarizers in accordance with a technique well known to mineralogists as a means of studying small changes in birefringence. The background is then a uniform cerise-pink color and birefringence in the diamond shows itself as a change from that color. Type II A diamonds which are regarded as acceptable will have either a uniform appearance substantially the same color as the background or a mottled appearance with a fine texture of pink, blue, and yellow coloration. Diamond pieces, however, which show extended patches greater than 0.1 millimeter across of any bright color (except the pink color like the background) or which show white color are rejected as being insufficiently pure for the present purpose and therefore unsuitable.

By these selection methods it is possible to select diamond pieces belonging to the same sub-group of type II A diamonds which are particularly pure and uniform as regards their thermal conductivity characteristics and which are, therefore, most suited for heat sink use.

As mentioned in the foregoing, in making the diamond blocks from a selected diamond the latter is first sawn into parallel slices which are slightly thicker than the desired thickness of the finished pieces. This sawing must be done in one of the preferred crystallographic directions, as is well known to diamond cutters. The slices so obtained are then polished on both the sawn faces until the desired thickness is reached. To ensure exact parallelism of these faces, during this polishing operation use may be made of an optical device in which a spot of light is reflected from both the front and rear surface of the diamond slice, and the two images brought into coincidence by proper adjustment of the angle at which the second face is polished.

The diamond slices so obtained must be sawn into blocks or cubes of the required small size which sawing operation cannot be performed efficiently for large scale production with the conventional means used in the art of diamond cutting. Diamond saws generally consist of discs of phosphor bronze having a diameter of for instance 5 centimeters and a thickness of for instance 0.07 millimeters, which discs are rotated at high speed, such as 10,000 revolutions per minute. The edge of the disc is loaded with the diamond powder applied as a suspension in a viscous oil. Due to the flexible nature of the saw, precise cutting is not normally possible since the saw tends to deflect sideways and produce a curved or irregular cut.

According to the invention, this problem may be overcome by mounting the diamond slice on a mounting member and arranging a saw guide comb member over said slice and mounting member which guide comb member has a number of teeth of a width corresponding to the minimum width of the blocks to be cut and has slots between these teeth adapted to receive a saw disc with little room for lateral play. A diamond saw is then moved through each of the comb slots to cut through said slice whereupon the mounting member is rotated through an angle of 90° with respect to the guide comb and the diamond saw is again moved through the comb slots to cut the slice a second time in a direction perpendicular to the first cuts, whereafter the small diamond blocks so obtained are removed from the mounting member. The guide comb efficiently prevents the saw disc from deflecting sideways. Thus straight parallel cuts in two directions can be made in the diamond slice mounted on the mounting member and blocks of uniform size and shape are obtained which are ready for use.

Figure 3:
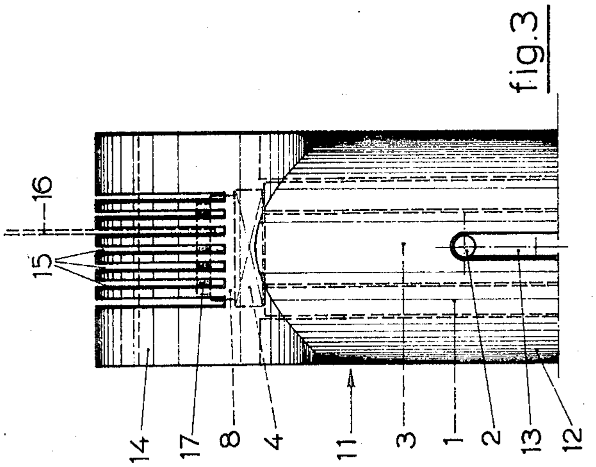
Figure 2:
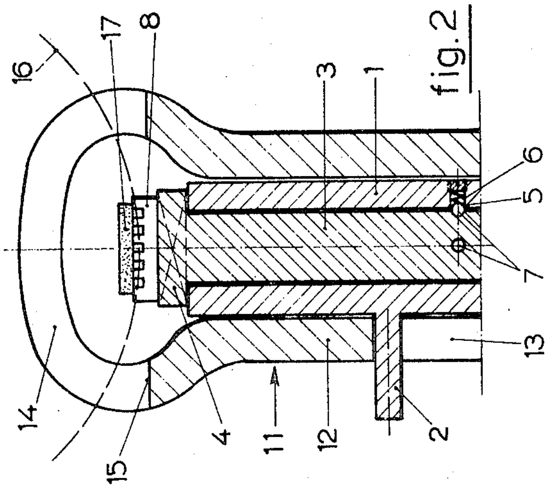
Figure 4:
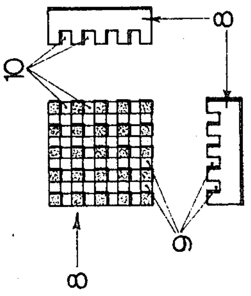

Referring now to the FIGS. 2, 3, and 4, the device there shown comprises a cylindrical sleeve member 1 which is fixedly mounted in a vertical position in the frame of the device (not shown). The sleeve 1 carries a locating pin extending radially outwardly at a suitable distance below the upper end of the sleeve. A rod-like supporting member 3 is received in the sleeve 1 with a close fit allowing the supporting member to rotate under applied torque with respect to the stationary sleeve 1. The supporting member has a head portion 4 of greater width and square shape which head portion rests on the annular end face of the sleeve 1. A spring-loaded ball 5 arranged in a radial bore 6 on the inner surface of the sleeve 1 co-operates with two notches 7 in the cylindrical surface of the member 3 to hold this member in one of two positions at right angles to each other.

A mounting plate 8 is arranged on the head portion 4 of the supporting member 3 and is secured thereto by brazing or soldering. As shown in FIG. 4, this mounting plate 8 has a square upper surface provided with two sets of equally spaced parallel grooves 9 and 10, respectively, intersecting each other at right angles.

A guide comb member generally indicated by 11 has a sleeve portion 12 fitting over the sleeve 1 and having an axially extending slot 13 which is open at the lower edge (not shown) of the sleeve portion and accommodates the locating pin 2. The sleeve portion 12 carries at its upper end a comb head portion 14 extending in a curve from one side of the sleeve portion over the mounting plate 8 to the opposite side of the sleeve portion, as shown in FIGS. 2 and 3. The head portion is provided with a number of parallel slots 15 which extend to a level below the upper surface of the mounting plate 8 and correspond in number and width to the slots 9 and 10 of this mounting plate. The comb slots 15 are so arranged that in the one position of the supporting member 3, as determined by the ball detent means 5,7, the comb slots 15 are exactly in alignment with the mounting plate grooves 10, and in the second position of the supporting member 3, at right angles to the first position, these comb slots are exactly in alignment with the mounting plate grooves 9. The slots 15 have a width only slightly larger than the thickness of a conventional disc-shaped diamond saw so that when such a saw disc is moved through one of the comb slots, as shown at 16, it cannot deflect sideways but is kept in a straight path.

In the use of the device, the guide comb member 11 is first removed from the sleeve 1 and a diamond slice 17 is glued with one of its parallel polished faces to the grooved upper surface of the mounting member 8. Any suitable cement or adhesive may be used for this purpose. The guide comb member 11 is again fitted over the sleeve 1 and pushed down until stopped by the locating pin abutting the bottom of the slot 13. With the supporting member 3 in one of its two positions the saw blade 16 of a conventional diamond sawing apparatus is now moved successively through the comb slots 15 to cut completely through the diamond, the grooves 9 or 10 in the mounting member 8 providing saw clearance. When the slice 17 has thus been cut into narrow strips, the supporting member 3 is turned through 90° to its other position and the saw blade is again moved successively through the comb slots 15 to cut the diamond strips into rectangular blocks. At the completion of this operation the guide comb member 11 is removed and the cement or adhesive is destroyed by suitable means such as dissolving it or by heating, to release the cubes.

In an alternative arrangement the locating pin 2 is placed lower on the supporting member 3 and the inner surface of the comb head opposite the mounting plate 8 is made flat whereby the guide comb member may rest with this flat surface on the diamond slice 17 and hold it in place on the mounting plate 8 by mechanical pressure in addition to glueing.

In case diamond blocks of larger size are required, for example for mounting two or more semi-conductor devices thereon, it is possible to pass the saw blade not through each successive comb slot but to jump one or more of these slots.

The body of the guide comb member can be made of brass and should be relatively thick (at least 1 millimeter) to provide good guidance for the saw. It would be further possible to use a gang saw comprising several spaced saw blades to saw in all the comb slots at the same time. However, this is generally not entirely satisfactory since the saw blades can have different cutting power and the load and tendency to deflect will thus be distributed unequally between the several blades.

Finally, the obtained sawn diamond pieces are examined microscopically and are checked between crossed polarizers with a full-wave plate as described above. This checking of birefringence may also be done at the intermediate stage on the diamond slices. This is permissible if the entire slice proves to be of good quality, but this checking will have to be repeated at the end if a part of the slice appears to be unsatisfactory. Edge pieces of the slice are generally rejected.

The above described sawing method allows an efficient large scale production of diamond blocks of the desired small size, high quality and purity suitable for industrial use as heat sinks.

As far as the invention has been described with reference to specific embodiments thereof, it will be understood that other embodiments may be resorted to without departing from the invention.

What is claimed is

1. A heat sink, in particular for mounting a small size power-dissipating solid-state device, comprising a piece of diamond, said diamond having at least one flat polished surface adapted for mounting said solid-state device thereon, and being of the type IIA having transmission characteristics for infrared rays showing a substantially level or rising transmission curve in the range of 7 to 8 micrometers wave length.

2. The heat sink of claim 1 in which said diamond piece is of substantially rectangular or cubic shape having a major dimension in the order of 0.3 to 1 millimeter and a weight in the range of 0.0005 to 0.02 carat.

* * * * *